(12) United States Patent
Niwa

(10) Patent No.: US 11,079,994 B2
(45) Date of Patent: Aug. 3, 2021

(54) MOUNTING APPARATUS

(71) Applicant: FUJI CORPORATION, Chiryu (JP)

(72) Inventor: Hidenori Niwa, Inazawa (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/348,316

(22) PCT Filed: Nov. 29, 2016

(86) PCT No.: PCT/JP2016/085383
§ 371 (c)(1),
(2) Date: May 8, 2019

(87) PCT Pub. No.: WO2018/100629
PCT Pub. Date: Jun. 7, 2018

(65) Prior Publication Data
US 2019/0265935 A1   Aug. 29, 2019

(51) Int. Cl.
*G06F 3/14*   (2006.01)
*H05K 13/08*   (2006.01)
(Continued)

(52) U.S. Cl.
CPC .............. *G06F 3/14* (2013.01); *G05B 19/409* (2013.01); *G06F 3/0482* (2013.01);
(Continued)

(58) Field of Classification Search
CPC ........................................................ G06F 3/14
(Continued)

(56) References Cited

U.S. PATENT DOCUMENTS 7,646,230 B2 * 1/2010 Parfitt .................. G05B 19/054
327/265
7,666,004 B2 * 2/2010 Johnson ............... H05K 7/1467
439/76.1
(Continued)

FOREIGN PATENT DOCUMENTS

JP   56-3462   6/1979
JP   6-61698 A   3/1994
(Continued)

OTHER PUBLICATIONS

Extended European Search Report dated Sep. 11, 2019 in Patent Application No. 16922863.2, 12 pages.
(Continued)

*Primary Examiner* — Reza Nabi
(74) *Attorney, Agent, or Firm* — Oblon, McClelland, Maier & Neustadt, L.L.P.

(57) ABSTRACT

A technique capable of reducing wiring is provided. The mounting apparatus includes a display input device capable of displaying an image of multiple selection items for controlling the operation of the mounting apparatus and for inputting commands for selecting any selection item from the multiple displayed selection items, a control device, and a single cable connecting the display input device and the control device. When a command for selecting the selection item is inputted, the display input device transmits a command signal corresponding to the inputted command to the control device via the cable. In addition to transmitting a video signal for displaying the multiple selection items to the display input device via the cable, the control device updates the video signal based on the command signal received from the display input device and transmits the updated video signal to the display input device.

9 Claims, 4 Drawing Sheets

(51) Int. Cl.
 *G06F 3/0482* (2013.01)
 *G06F 3/0484* (2013.01)
 *H04N 7/10* (2006.01)
 *G05B 19/409* (2006.01)
 *G09G 5/00* (2006.01)
 *H05K 13/00* (2006.01)

(52) U.S. Cl.
 CPC ........... *G06F 3/0484* (2013.01); *G09G 5/003* (2013.01); *H04N 7/10* (2013.01); *H05K 13/00* (2013.01); *H05K 13/0882* (2018.08); *G09G 2354/00* (2013.01); *G09G 2370/06* (2013.01); *G09G 2370/12* (2013.01)

(58) Field of Classification Search
 USPC ........................................................ 715/771
 See application file for complete search history.

(56) References Cited

U.S. PATENT DOCUMENTS

| | | | | |
|---|---|---|---|---|
| 2008/0152023 | A1* | 6/2008 | Yoshida | G06F 3/14 375/257 |
| 2011/0010473 | A1* | 1/2011 | Szolyga | G06F 1/1601 710/36 |
| 2011/0179456 | A1* | 7/2011 | Bar-Niv | H04N 7/106 725/85 |
| 2011/0239257 | A1* | 9/2011 | Bar-Niv | H04N 21/43615 725/78 |
| 2013/0083242 | A1* | 4/2013 | Sirpal | G06F 3/04883 348/564 |
| 2013/0159565 | A1* | 6/2013 | Soyannwo | G09G 5/006 710/33 |
| 2015/0049028 | A1* | 2/2015 | Pollmann | G06F 3/03545 345/173 |
| 2015/0134860 | A1* | 5/2015 | Lee | G06F 13/4221 710/9 |
| 2016/0030835 | A1* | 2/2016 | Argiro | G06F 3/016 463/33 |
| 2016/0174426 | A1* | 6/2016 | Kurata | H05K 13/084 29/739 |
| 2016/0216829 | A1* | 7/2016 | Lin | G06F 3/0488 |
| 2016/0224528 | A1* | 8/2016 | Trevarthen | G06F 3/04883 |
| 2019/0265935 | A1* | 8/2019 | Niwa | G06F 3/0482 |

FOREIGN PATENT DOCUMENTS

| | | |
|---|---|---|
| JP | 2004-87999 A | 3/2004 |
| JP | 2005-101644 A | 4/2005 |
| JP | 2013-214754 A | 10/2013 |
| WO | WO 2015/168716 A1 | 11/2015 |

OTHER PUBLICATIONS

International Search Report dated Feb. 28, 2017 in PCT/JP2016/085383 filed on Nov. 29, 2016.

* cited by examiner

MOUNTING APPARATUS

TECHNICAL FIELD

The technology disclosed in this specification relates to a mounting apparatus for mounting a component on a board.

BACKGROUND ART

Patent Literature 1 (JP-A-Hei06-061698) discloses a mounting apparatus for mounting a component on a board. The mounting apparatus includes a control device (i.e., a host computer) for controlling the operation of the mounting apparatus.

BRIEF SUMMARY

Technical Problem

Since various signals are transmitted to the control device (i.e., the host computer), multiple wires are connected to the control device. However, if the number of wires is large, dealing with the wiring becomes complicated. Therefore, the present specification provides a technique for reducing the wiring.

Solution to the Problem

The mounting apparatus disclosed in this specification mounts a component on a board. The mounting apparatus includes a display input device capable of displaying an image of multiple selection items for controlling the operation of the mounting apparatus and capable of receiving a command for selecting any selection item from the multiple selection items displayed, a control device, and a single cable connecting the display input device to the control device. When a command for selecting the selection item is inputted, the display input device transmits a command signal corresponding to the inputted command to the control device via the cable. In addition to transmitting a video signal for displaying the multiple selection items to the display input device via the cable, the control device updates the video signal based on the command signal received from the display input device and transmits the updated video signal to the display input device.

With such a configuration, via a single cable, the command signal is transmitted from the display input device to the control device and the video signal is transmitted from the control device to the display input device. As a result, the number of cables can be reduced and, therefore, wiring is reduced.

In the above mounting apparatus, the single cable may include a first region and a second region. The command signal may be transmitted via the first region, and the video signal may be transmitted via the second region.

With such a configuration, the command signal and the video signal can be transmitted by effectively utilizing multiple regions in the cable.

The mounting apparatus may further include a switch for switching over the operation of the mounting apparatus. The switch may transmit a switch signal to the control device via the cable. The control device may update the video signal based on the switch signal received from the switch and transmit the video signal to the display input device.

With such a configuration, in addition to the command signal and the video signal, the switch signal is transmitted via the single cable, further reducing the amount of wiring.

The single cable may further include a third region. The switch signal may be transmitted via the third region.

With such a configuration, the switch signal can be transmitted by effectively utilizing the multiple regions in the cable.

The mounting apparatus may include an operation unit in which the display input device and the switch are disposed side by side.

With such a configuration, since the display input device and the switch are integrally configured, the device can be made compact.

DESCRIPTION OF EMBODIMENTS

Figure 1:
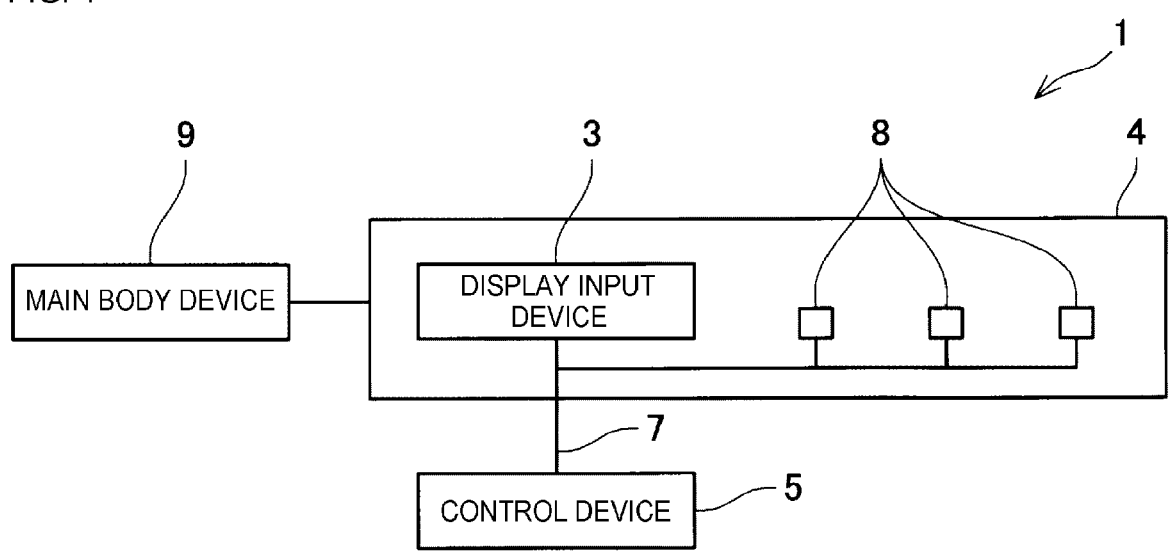
FIG. 1 is a block diagram showing a schematic configuration of a mounting apparatus.

A mounting apparatus of a first embodiment of the invention will be described with reference to the drawings. Mounting apparatus 1 is a device for mounting components on a board. As shown in FIG. 1, mounting apparatus 1 includes main body device 9, display input device 3, multiple switches 8, control device 5, and cable 7 connected to display input device 3 and control device 5.

The configuration of main body device 9 is not particularly limited. For example, main body device 9 includes a supply device for supplying a component to be mounted on a board, a conveyance device for conveying and positioning the board to a predetermined position, a holding device for holding the component supplied by the supply device by suction, and a driving device for moving the holding device. In main body device 9, the holding device moves to the board while holding a component by suction and mounts the component on the board. Further, main body device 9 may include an imaging device or the like for capturing an image of a component. Main body device 9 is electrically connected to display input device 3. A control signal is transmitted from display input device 3 to main body device 9.

Figure 2:
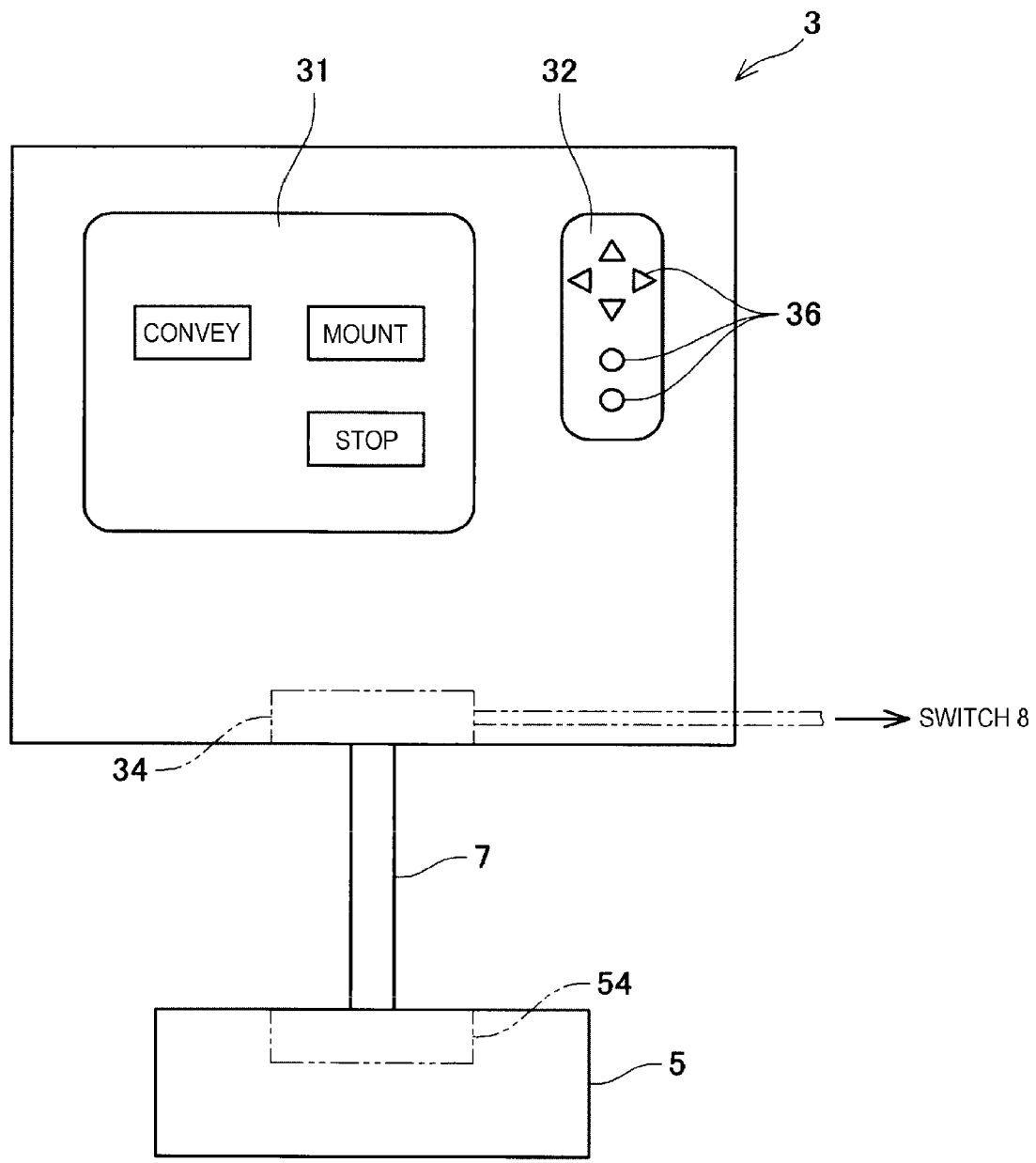
FIG. 2 is a diagram showing an example of a display input device.

As shown in FIG. 2, display input device 3 includes display section 31 and input section 32. Display section 31 and input section 32 are disposed next to each other. Display section 31 is, for example, a liquid crystal panel, and can display images of multiple selection items for controlling the operation of mounting apparatus 1. The multiple selection items include, for example, a "convey" selection item for conveying and positioning a board on which a component is to be mounted to a predetermined position, a "mount" selection item for mounting a component on a board positioned at a predetermined position, and a "stop" selection item for stopping the operation of mounting apparatus 1. Specific examples of the multiple selection items are not particularly limited.

Input section 32 includes multiple command buttons 36, and a command for selecting any selection item from the multiple selection items displayed on display section 31 can be inputted via the multiple command buttons 36. The multiple command buttons 36 for inputting a command include, for example, MOVE buttons, an ENTER button, a GO-BACK button, and the like. The MOVE buttons include, for example, a RIGHT button, a LEFT button, an UP button, a DOWN button, and the like. The RIGHT button can be used to input a "move to the right" command, the LEFT button can be used to input a "move to the left" command, the UP button can be used to input a "move up" command, and the DOWN button can be used to input a "move down" command. Further, the ENTER button can be used to input an "ENTER" command and the GO-BACK button can be used to input a "go back" command. Specific examples of commands are not particularly limited. The user of mounting apparatus 1 operates multiple command buttons 36, whereby a selection item desired by the user can be selected from multiple selection items. As an example of an operation of the multiple command buttons 36, the user can sequentially press the RIGHT button, the DOWN button, and the ENTER button in order to select the "stop" selection item from the multiple selection items.

Display input device 3 includes a CPU and memory, both of which are not shown, and the CPU executes predetermined information processing based on a program stored in the memory. Display input device 3 includes communication port 34 and can transmit and receive various signals via communication port 34. The single cable 7 is connected to communication port 34 of display input device 3.

The multiple switches 8 shown in FIG. 1 are configured to switch over the operation of mounting apparatus 1. The operation of mounting apparatus 1 can be switched on and off by switching the on/off of switch 8. Switches 8 includes, for example, an "emergency stop" switch for applying an emergency stop to mounting apparatus 1, a "temporary stop" switch for temporarily stopping mounting apparatus 1, a "resume operation" switch for resuming operation of mounting apparatus 1, and the like. When switch 8 is switched, the operation of mounting apparatus 1 is switched. For example, when the user of mounting apparatus 1 turns on the "emergency stop" switch 8, an emergency stop is applied to mounting apparatus 1. When the user turns off "emergency stop" switch 8, the emergency stop on mounting apparatus 1 is released. When the user turns on the "resume operation" switch 8, mounting apparatus 1 resumes operation. Specific examples of the switch are not particularly limited.

Display input device 3 and the multiple switches 8 are disposed side by side in operation unit 4. Display input device 3 and the multiple switches 8 are integrated by way of operation unit 4. Operation unit 4 includes, for example, a single housing, and display input device 3 and the multiple switches 8 are attached to the housing. As shown in FIG. 2, the multiple switches 8 are electrically connected to communication port 34 of display input device 3.

Control device 5 includes a CPU and memory, both of which are not shown, and the CPU executes predetermined information processing based on a program stored in the memory. As shown in FIG. 2, control device 5 includes communication port 54 and can transmit and receive various signals via communication port 54. The single cable 7 is connected to communication port 54 of control device 5.

Figure 3:
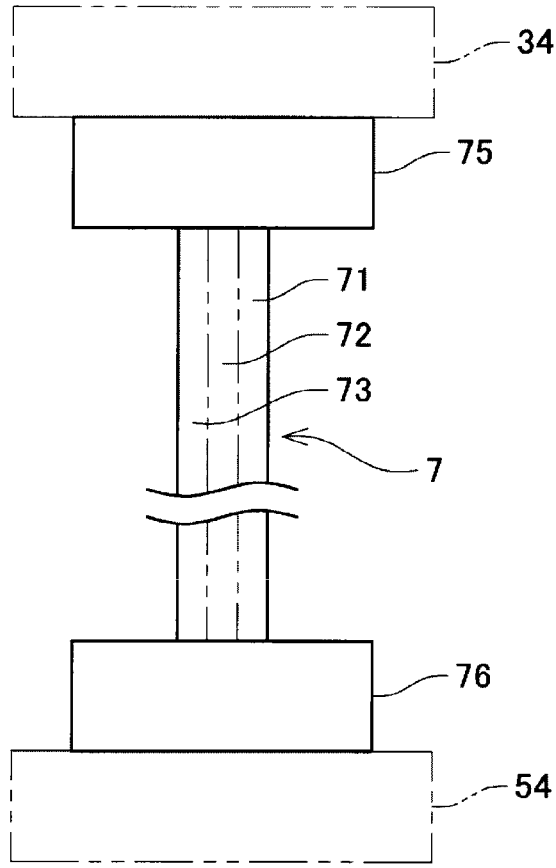
FIG. 3 is a diagram showing an example of a cable.

The single cable 7 electrically connects display input device 3 and control device 5. As shown in FIG. 3, cable 7 has first connector 75 and second connector 76. First connector 75 of cable 7 is connected to communication port 34 of display input device 3. Second connector 76 of cable 7 is connected to communication port 54 of control device 5. Cable 7 is, for example, a link cable and can transmit and receive various signals. Cable 7 has multiple regions, and multiple signals can be transmitted and received via the multiple regions. Multiple signals may be allocated to each region. Cable 7 of the first embodiment has three regions, that is, first region 71, second region 72, and third region 73. A command signal is transmitted and received via first region 71 of cable 7, a video signal is transmitted and received via second region 72, and a switch signal is transmitted and received via third region 73. The command signal, the video signal, and the switch signal will be described later.

Next, the operation of mounting apparatus 1 having the above configuration will be described. First, in the initial state, as shown in FIG. 2, it is assumed that images of multiple selection items for controlling the operation of mounting apparatus 1 are displayed on the display section 31 of display input device 3. For example, it is assumed that images of a "convey" selection item, a "mount" selection item, and a "stop" selection item are displayed on display section 31.

Figure 4:
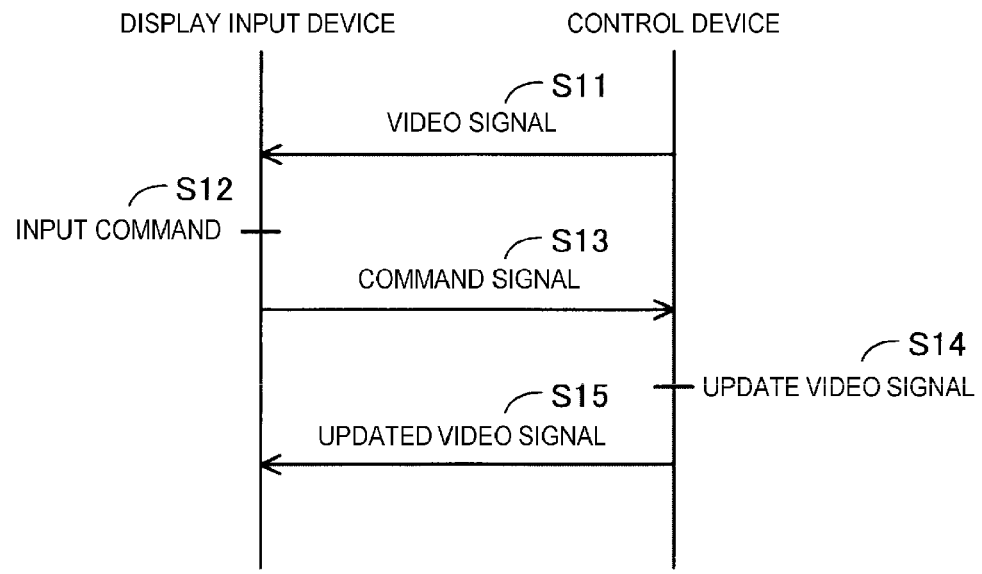
FIG. 4 is a sequence diagram showing an operation of the mounting apparatus.

In order to display images of multiple selection items on display section 31 of display input device 3, as shown in FIG. 4, control device 5 transmits a video signal to display input device 3 (S11 of FIG. 4). Control device 5 transmits a video signal for displaying multiple selection items to display input device 3. Control device 5 transmits the video signal to display input device 3 via the single cable 7. The video signal is transmitted via second region 72 of cable 7. Upon receiving the video signal, display input device 3 displays the image on display section 31 based on the video signal.

It is assumed that the user of mounting apparatus 1 inputs a command from input section 32 of display input device 3 from this initial state (S12 of FIG. 4). It is also assumed that the user of mounting apparatus 1 inputs a command from input section 32 so that the user can select a desired selection item from the multiple selection items. For example, the user can input the "enter" command by pressing the ENTER button while the "convey" selection item is displayed as active on display section 31 of display input device 3. Upon doing so, the "convey" selection item is selected. As a result, it is possible for the user to select the desired "convey" selection item from the multiple selection items.

When a command is inputted from input section 32 of display input device 3, display input device 3 transmits a command signal corresponding to the input command to control device 5 (S13 of FIG. 4). Display input device 3 transmits a command signal to control device 5 via the single cable 7. The command signal is transmitted via first region 71 of cable 7. Control device 5 receives the command signal.

Upon receiving the command signal, control device 5 updates the video signal based on the command signal (S14 of FIG. 4). For example, when the command of "enter" is inputted and the "convey" selection item is selected, control device 5 generates a new video signal corresponding to the selected "convey" selection item. More specifically, control device 5 generates a video signal for displaying an image of new selection items corresponding to the "convey" selection item. The new selection items corresponding to the "convey" selection item may include an "increase conveyance speed" selection item for increasing the conveying speed of the board, a "decrease conveyance speed" selection item for decreasing the conveying speed of the board, and the like. Control device 5 generates a video signal for displaying images of the "increase conveyance speed" selection item and the "decrease conveyance speed" selection item. Control device 5 updates the video signal to a video signal newly generated from the video signal in the initial state.

Upon updating the video signal, control device 5 transmits the updated video signal to display input device 3 (S15 of FIG. 4). Control device 5 transmits the new video signal to display input device 3 via the single cable 7. The new video signal is transmitted via second region 72 of cable 7. Display input device 3 receives the new video signal.

Upon receiving the new video signal, display input device 3 displays the new image in display section 31 based on the video signal. For example, the images of the "increase conveyance speed" selection item and the "decrease conveyance speed" selection item are displayed on display section 31.

The configuration and the operation of mounting apparatus 1 of the first embodiment have been described above. As is apparent from the above description, mounting apparatus 1 of the first embodiment includes display input device 3, control device 5, and the single cable 7 connecting display input device 3 and control device 5. Display input device 3 displays images of multiple selection items for controlling the operation of mounting apparatus 1 and can receive a command for selecting a selection item from the multiple selection items displayed. When a command for selecting a selection item is inputted, display input device 3 transmits a command signal corresponding to the command to control device 5 via cable 7. Control device 5 transmits a video signal for displaying multiple selection items to display input device 3 via cable 7 and, based on the command signal received from display input device 3, updates the video signal and transmits the updated video signal to display input device 3.

With such a configuration, the command signal is transmitted from display input device 3 to control device 5 via the single cable 7, and the video signal is transmitted from control device 5 to display input device 3. Therefore, since the number of cables 7 are reduced, wiring can be reduced.

In mounting apparatus 1, the single cable 7 has first region 71 and second region 72, and a command signal is transmitted via first region 71 and a video signal is transmitted via second region 72. With such a configuration, a command signal and a video signal can be transmitted by effectively utilizing multiple regions in cable 7.

Although the first embodiment has been described above, specific embodiments are not limited to the first embodiment described above. In the following description, the same components as those in the above description are denoted by the same reference numerals, and description thereof is omitted.

Figure 5:
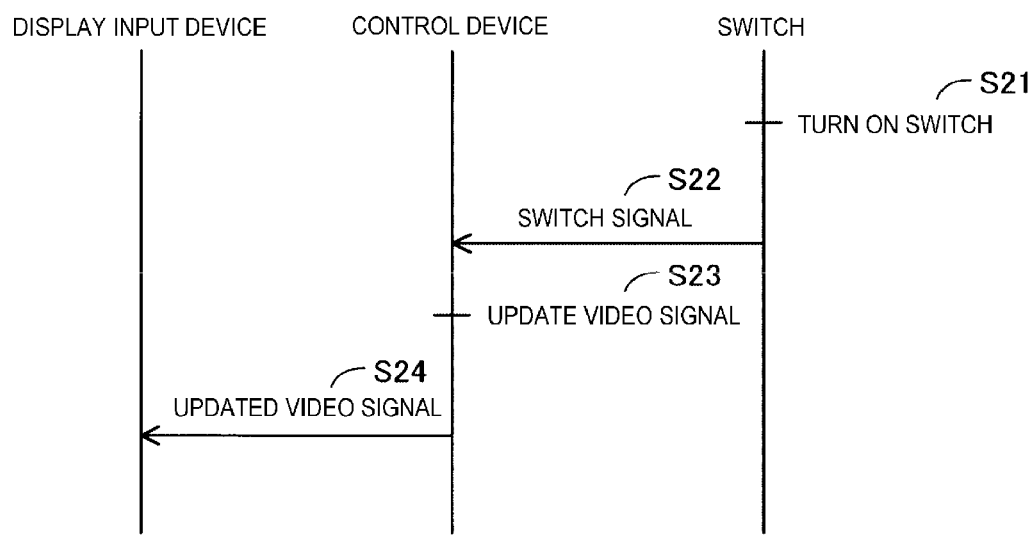
FIG. 5 is a sequence diagram showing an operation of the mounting apparatus of a second embodiment.

In the first embodiment, a configuration in which a command signal is transmitted via cable 7 has been described, but the present invention is not limited to this configuration. In a second embodiment, the switch signal may be transmitted via cable 7. More specifically, as shown in FIG. 5, it is assumed that the user of mounting apparatus 1 switches any one of multiple switches 8 (S21 in FIG. 5). For example, suppose that the user turns on the "emergency stop" switch 8 to apply an emergency stop on mounting apparatus 1. When switch 8 is switched, a corresponding switch signal is transmitted from switch 8 to control device 5 (S22 of FIG. 5). Switch 8 transmits the switch signal to control device 5 via the single cable 7. The switch signal is transmitted via third region 73 of cable 7. Control device 5 receives the switch signal.

Upon receiving the switch signal, control device 5 updates the video signal based on the switch signal (S23 of FIG. 5). For example, when the "emergency stop" switch 8 is turned on, a new video signal corresponding to "emergency stop" is generated. Control device 5 then generates a video signal for displaying the "emergency stop" symbol on display section 31 of display input device 3. Alternatively, a video signal for displaying new selection items on input section 32 is generated. For example, when an emergency stop is applied to mounting apparatus 1, a video signal such as an "alarm" selection item for sending out a warning to the periphery of mounting apparatus 1, a "shut-off" selection item for shutting off communication of the main body device 9, or the like can be generated. Control device 5 updates the current video signal to a newly generated video signal.

When the video signal is updated, control device 5 transmits the updated video signal to display input device 3 (S24 of FIG. 4). Control device 5 transmits the new video signal to display input device 3 via the single cable 7. The new video signal is transmitted via second region 72 of cable 7. Display input device 3 receives the new video signal.

Upon receiving the new video signal, display input device 3 displays the new image in display section 31 based on the video signal.

The operation of the second embodiment of mounting apparatus 1 has been described above. As is apparent from the above description, mounting apparatus 1 includes switch 8 for switching the operation of mounting apparatus 1. Switch 8 transmits a switch signal to control device 5 via cable 7. Control device 5 updates the video signal based on the switch signal received from switch 8 and transmits the video signal to display input device 3. With such a configuration, in addition to the command signal and the video signal, the switch signal is transmitted via the single cable 7 so that wiring can be further reduced.

In mounting apparatus 1, the single cable 7 includes third region 73, and the switch signal is transmitted via third region 73. With such a configuration, the switch signal can be transmitted by effectively utilizing the multiple regions in cable 7.

Mounting apparatus 1 has operation unit 4 in which display input device 3 and switch 8 are disposed side by side. With such a configuration, the device can be made compact since display input device 3 and switch 8 are integrally configured.

OTHER EMBODIMENTS

In the first and second embodiments, display section 31 and input section 32 of display input device 3 are separated from each other, but the present invention is not limited to this configuration. In a third embodiment, display section 31 and input section 32 of display input device 3 are integrated into a touch panel.

While specific examples of the present invention have been described in detail above, these are only examples and are not intended to limit the scope of the claims. The technology described in the claims includes various modifications and variations of the specific examples illustrated above. The technical elements described in this specification or the drawings exhibit technical usefulness alone or in various combinations, and are not limited to the combinations described in the claims at the time of filing. Further, the technology illustrated in this specification or the drawings can simultaneously achieve multiple objectives, and achieving one of the objectives has technical usefulness by itself.

LIST OF REFERENCE SIGNS

1: Mounting apparatus, 3: Display input device, 4: Operation unit, 5: Control device, 7: Cable, 8: Switch, 9: Main body device, 31: Display section, 32: Input section, 34: Communication port, 36: Command button, 54: Communication port, 71: First region, 72: Second region, 73: Third region, 75: First connector, 76: Second connector.

The invention claimed is:

1. A mounting apparatus for mounting a component on a board, the mounting apparatus comprising:
   a main body including:
      a supply device configured to supply the component to be mounted on the board,
      a conveyance device configured to convey and position the board to a predetermined position,
      a holding device configured to hold the component supplied by the supply device, and
      a driving device configured to move the holding device;
   a display input device electrically connected to the main body, the display device configured to:
      display an image of multiple selection items for controlling an operation of the main body, and
      receive a command for selecting any selection item from the multiple displayed selection items;
   a control device; and
   a single cable connecting the display input device and the control device, wherein
   the display input device is configured to transmit a command signal corresponding to the command to the control device via the single cable when the command is inputted for selecting the selection item, and
   the control device is configured to:
      transmit a video signal, for displaying the image of the multiple selection items, to the display input device via the single cable,
      update the video signal based on the command signal received from the display input device, and
      transmit the updated video signal to the display input device.

2. The mounting apparatus of claim 1, further comprising:
   a switch for switching the operation of the main body, wherein
   the switch transmits a switch signal to the control device via the single cable, and
   the control device is configured to:
      update the video signal based on the switch signal received from the switch, and transmit the updated video signal to the display input device.

3. The mounting apparatus of claim 2, wherein the switch includes a plurality of switches including:
   an emergency stop switch for applying an emergency stop to the mounting apparatus,
   a temporary stop switch for temporarily stopping the mounting apparatus, and
   a resume operation switch for resuming operation of the mounting apparatus.

4. The mounting apparatus of claim 3, wherein when the emergency stop switch turned on, the updated video signal corresponds to an emergency stop.

5. The mounting apparatus of claim 3, wherein when the emergency stop switch turned on, the updated video signal includes new selection items.

6. The mounting apparatus of claim 5, wherein when the new selection items include:
   an alarm selection item for sending out a warning to a periphery of the mounting apparatus, and
   a shut-off selection item for shutting off communication of the main body.

7. The mounting apparatus according to claim 1, further comprising:
   an operation unit in which the display input device and the switch are disposed side by side.

8. The mounting apparatus of claim 1, wherein the multiple selection items include:
   a convey selection item for controlling the conveyance device to convey and position the board to the predetermined position,
   a mount selection item for controlling the mounting of the component on the board positioned at a predetermined position, and
   a stop selection item for stopping the operation of the mounting apparatus.

9. The mounting apparatus of claim 1, wherein
   one of the multiple selection items includes a convey selection item for controlling the conveyance device to convey and position the board to the predetermined position,
   the video signal includes the convey selection item, and
   the updated video signal includes new selection items corresponding to the convey selection item.

* * * * *